(12) United States Patent
Yoshioka et al.

(10) Patent No.: US 6,810,548 B2
(45) Date of Patent: Nov. 2, 2004

(54) CLEANING APPARATUS

(75) Inventors: Hiroto Yoshioka, Taki-gun (JP);
Takeshi Hara, Matsusaka (JP); Kazuki Kobayashi, Izumi (JP); Hitoshi Ono, Nara (JP); Takashi Kimura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 204 days.

(21) Appl. No.: 09/800,800

(22) Filed: Mar. 7, 2001

(65) Prior Publication Data
US 2001/0027797 A1 Oct. 11, 2001

(30) Foreign Application Priority Data

Mar. 8, 2000 (JP) ........................................ 2000-063897

(51) Int. Cl.[7] .......................... A46B 13/02; B08B 11/00
(52) U.S. Cl. .............................. 15/77; 15/21.1; 15/88.2; 15/88.3
(58) Field of Search .................. 15/21.1, 77, 88.2, 15/88.3, 102

(56) References Cited

U.S. PATENT DOCUMENTS

| | | | | |
|---|---|---|---|---|
| 5,345,639 | A | * | 9/1994 | Tanoue |
| 6,059,891 | A | * | 5/2000 | Kubota |
| 6,158,075 | A | * | 12/2000 | Tanaka |
| 6,175,983 | B1 | * | 1/2001 | Hirose |
| 6,248,180 | B1 | * | 6/2001 | Sato |
| 6,292,972 | B1 | * | 9/2001 | Ishihara et al. ................. 15/77 |
| 6,385,805 | B2 | * | 5/2002 | Konishi |

FOREIGN PATENT DOCUMENTS

| | | |
|---|---|---|
| EP | 0 872 782 A2 | 10/1998 |
| JP | 06-005577 | 1/1994 |
| JP | 07-086222 | 3/1995 |
| JP | 07-249605 | 9/1995 |
| JP | 09-327671 | 12/1997 |
| JP | 11-087288 | 3/1999 |
| JP | 11-300300 | 11/1999 |
| TW | 270904 | 2/1996 |
| TW | 341534 | 10/1998 |
| TW | 371418 | 10/1999 |

OTHER PUBLICATIONS

Taiwanese Patent Office First Office Action dated Nov. 5, 2003 (2 pp.) for application No. 90104763 and English Translation (4 pp).
Korean Patent Office First Office Action dated Apr. 30, 2003 (2 pp.) for application No. 10–2001–11161 and English Translation (3 pp).
Taiwanese Patent Office Action (Notice of First Rejection).

* cited by examiner

Primary Examiner—Randall Chin
(74) Attorney, Agent, or Firm—Edwards & Angell, LLP; David G. Conlin; George W. Hatnell, III

(57) ABSTRACT

A cleaning apparatus of the present invention includes a roll brush for scrubbing the surface of the substrate, and an ultrasonic nozzle for blowing an aqueous cleaning solution against the surface of the substrate and generating an ultrasonic wave, wherein the roll brush and the ultrasonic nozzle are provided so as to oppose one another so that the substrate can be set in between. With the synergetic effects of brush scrubbing cleaning, ultrasonic cleaning and shower-cleaning, the precision cleaning of the upper surface of the substrate can be performed at a sufficient level of cleanliness. Moreover, in a state where the substrate to be cleaned is set, the roll brush can be cleaned automatically by the ultrasonic nozzle, and it is therefore possible to maintain the roll brush at high level of cleanliness without requiring maintenance operations. Furthermore, by integrating the roll brush and the ultrasonic wave nozzle in one part, the size of the apparatus can be reduced in the transport direction of the substrate, thereby reducing an overall footprint area.

27 Claims, 6 Drawing Sheets

CLEANING APPARATUS

FIELD OF THE INVENTION

The present invention generally relates to a cleaning apparatus for precision cleaning of various products made of semiconductor, glass, plastic, metal, etc., such as an IC (Integrated Circuit) wafer, a semiconductor wafer of the IC wafer, a liquid crystal panel, a glass substrate of the liquid crystal panel, a plasma display, a glass substrate of the plasma display, an optical device, an optical fiber, precision components (metal precision components) for semiconductor, or the like, and more particularly relates to a cleaning apparatus for precision cleaning of such products using a cleaning brush and an ultrasonic vibrator.

BACKGROUND OF THE INVENTION

For the precision processing of substrates such as glass substrates for a semiconductor wafer, a liquid crystal panel, etc., is generally performed in the following manner. Wires, an insulating film, and a film such as a semiconductor layer, etc., are formed, and the structure as desired is produced by a similar technique to the photographic printing technique, called photolithography. However, when performing precision processing by photolithography, the problem arises in that particulate contaminant (dust particles) adhering to the surface of the substrate causes defects such as disconnection, shorting, and inferior patterning, which lower the yield.

Therefore, conventionally, the substrate is always subjected to the precision cleaning before precision-processing it by the photolithography, and for this precision cleaning of the substrate, various cleaning apparatuses have been proposed.

In the conventional cleaning apparatus, a brush cleaning vessel and an ultrasonic cleaning vessel are provided separately, and a brush scrubbing cleaning and an ultrasonic cleaning are performed independently in the brush cleaning vessel and the ultrasonic cleaning vessel respectively. For this structure, the conventional cleaning apparatus is required to have a large size, and a large footprint (area of the bottom surface of the apparatus).

As an example of such conventional cleaning apparatus, a conveyer-type single wafer cleaning apparatus will be explained in reference to FIG. 5 and FIG. 6.

This type of conventional cleaning apparatus is provided with a brush cleaning vessel 101 illustrated in FIG. 5. As illustrated in FIG. 5, the brush cleaning vessel 101 includes a roll brush 102 for cleaning a substrate 110, shower nozzles 103 for blowing an aqueous cleaning agent 111 against the substrate 110 for shower-cleaning, and transport rollers 104 for transporting the substrate 110 in a horizontal direction.

The roll brush 102 has a rotation mechanism (not shown) and scrubs the upper surface of the substrate 110 while rotating thereon for brush cleaning. The shower nozzles 103 are provided for applying the aqueous cleaning agent 111 onto the surface of the substrate 110 by blowing thereto the aqueous cleaning agent 111 and also for shower-cleaning the surface of the substrate 110. The transport rollers 104 are provided for transporting the substrate 110 in the horizontal direction while rotating on the lower surface of the substrate 110. The brush cleaning vessel 101 is provided in the cleaning apparatus as an independent vessel. After the brush cleaning is performed in the cleaning vessel 101, the substrate 110 is placed in the ultrasonic cleaning vessel 105 illustrated in FIG. 6 for the subsequent ultrasonic cleaning.

As shown in FIG. 6, the ultrasonic cleaning vessel 105 includes an ultrasonic nozzle 106 for ultrasonically cleaning the substrate 110 from thereabove, and transport rollers 107 for transporting the substrate 110 in the horizontal direction.

The ultrasonic nozzle 106 blows the aqueous cleaning agent 111 from its leading end against the upper surface of the substrate 110 and ultrasonically vibrates the aqueous cleaning agent 111 by means of an ultrasonic vibrator (not shown) stored therein, thereby ultrasonically cleaning the upper surface of the substrate 110. The transport rollers 107 are provided for transporting the substrate 110 in the horizontal direction while rotating on the lower surface of the substrate 110.

As described, in the conventional cleaning apparatus, the brush scrubbing cleaning and the ultrasonic cleaning are performed in different vessels respectively. However, in the conventional cleaning apparatus of the foregoing structure, the removal of particulate contamination (dust particles) to the sufficient level of cleanliness cannot be ensured. Moreover, an overall footprint area of the cleaning apparatus becomes larger.

In response, another cleaning apparatus has been proposed wherein brush cleaning and ultrasonic cleaning are performed in the same vessel.

For example, Japanese Unexamined Patent Publication No. 87288/1999 (Tokukaihei 11-87288) published on Mar. 30, 1999 discloses a substrate cleaning apparatus wherein a cleaning brush and an ultrasonic nozzle are provided in parallel on one side of the substrate, so that the brush scrubbing cleaning and the ultrasonic cleaning can be performed simultaneously to effectively remove from the surface of the substrate the particulate contamination (dust particles) as well as fiber particles released from the cleaning brush.

Japanese Unexamined Patent Publication No. 86222/1995 (Tokukaihei 7-86222) published on Mar. 31, 1995 discloses another substrate cleaning apparatus wherein a cleaning brush and an ultrasonic nozzle are provided adjacently to improve the cleaning power of the substrate and at the same time to suppress the contamination of the cleaning brush.

Japanese Unexamined Patent Publication No. 5577/1994 (Tokukaihei 6-5577) published on Jan. 14, 1994 discloses still another substrate cleaning apparatus which performs a brush scrubbing cleaning in a cleaning vessel, wherein an overflow vessel storing therein an ultrasonic vibrator is adopted as a cleaning vessel to eliminate the problem of the contamination of the cleaning brush.

However, according to the cleaning apparatus of Japanese Unexamined Patent Publication No. 87288/1999, the cleaning brush and the ultrasonic nozzle always clean different parts of the substrate as is clear when thinking about only one particular part on the surface of the substrate. Specifically, for example, immediately after the cleaning brush has passed on the part for the brush cleaning, the ultrasonic nozzle passes that part for the ultrasonic cleaning. Therefore, precisely speaking, these two kinds of cleaning system are not applied to one part simultaneously but sequentially in a short time.

The foregoing structure merely offers an effect as achieved by reducing the switch time from the brush cleaning to the ultrasonic cleaning, i.e., the likelihood of the problem that the fibrous particles adhering to the substrate are dried and become difficult to be removed from the surface of the substrate can be suppressed. In this structure, however, an improvement in removing power of particulate contamination (dust particles) as well as an improvement in suppressing a reduction in yield due to the particulate contamination (dust particles) can be hardly expected as compared to the aforementioned cleaning apparatus of the structure wherein the brush cleaning and the ultrasonic cleaning are performed independently in different vessels. Therefore, the foregoing cleaning apparatus cannot provide a sufficient level of cleanliness to meet the increasing demand for cleaning of an improved precision (fineness).

Moreover, in the foregoing structure, the cleaning brush and the ultrasonic nozzle are provided in parallel on the same plane, and thus the cleaning brush itself is not subjected to the ultrasonic cleaning. Therefore, the longer is the operation time of the cleaning apparatus, the more is likely that the cleaning brush takes in the particulate contamination (dust particles) once removed out of the substrate surface, and such contamination once captured by the cleaning brush are redeposited on the surface of the substrate. Therefore, for the foregoing conventional apparatus, periodic maintenance operations are needed for cleaning the cleaning brush, such as cleaning the brush by taking it out of the apparatus, etc., in order to prevent the above problem. However, for the maintenance operations, it is required to stop the operation of the cleaning apparatus, and perform troublesome and time consuming operations, resulting in efficient cleaning.

In summary, the cleaning apparatus of Japanese Unexamined Patent Publication No. 87288/1999 has the following deficiencies.
1. Firstly, although the cleaning brush and the ultrasonic nozzle are driven simultaneously, because these members are provided on the same surface of the substrate, the brush scrubbing cleaning and ultrasonic cleaning can never be applied to the same part simultaneously. Namely, although the cleaning brush and the ultrasonic nozzle are driven simultaneously, the brush scrubbing cleaning and the ultrasonic cleaning can never be applied to the same part on the substrate surface simultaneously. Therefore, an improvement in removing power for the fibrous particles released from the cleaning brush does not lead to an improvement in removing power for the particulate contamination (dust particles). Therefore, the foregoing cleaning apparatus cannot provide a sufficient level of cleanliness to meet the increasing demand for cleaning of an improved precision (fineness).
2. Secondly, in the structure wherein the cleaning brush and the ultrasonic nozzle are provided in parallel on the same plane, the cleaning brush cannot be cleaned in the normal operation of the cleaning apparatus. Therefore, the troublesome maintenance operations are required for the cleaning of the cleaning brush.

The foregoing cleaning apparatus of Japanese Unexamined Patent Publication No. 86222/1995 also has the following problem. That is, in the structure wherein the ultrasonic nozzle is provided on the side of the cleaning brush, the ultrasonic wave and the aqueous cleaning agent supplied from the ultrasonic nozzle have difficulty reaching the part to be brush-cleaned on the surface of the substrate that is being disturbed by the cleaning brush. Therefore, the ultrasonic cleaning is specifically applied to the part surrounding the cleaning brush, and is hardly applied to the part to be brush-cleaned on the surface of the substrate.

The foregoing cleaning apparatus is provided with an ultrasonic nozzle for cleaning the cleaning brush. However, it is still difficult for the aqueous cleaning agent or the ultrasonic wave as supplied from the ultrasonic nozzle to reach the central part of the cleaning brush. Therefore, the cleaning of the cleaning brush by the ultrasonic nozzle is applied only to the side of a disk brush (cleaning brush), not to the central part of the disk brush. As a result, the particulate contamination (dust particles) is liable to remain in the central part of the disk brush, and the contamination of the substrate is liable to occur.

Moreover, in the foregoing cleaning apparatus, the aqueous cleaning agent and the ultrasonic wave supplied through the ultrasonic nozzle are reflected from the surface of the substrate to be incident on the surface of the cleaning brush. Therefore, in the state where the substrate is not set in the cleaning apparatus, neither of the aqueous cleaning agent nor ultrasonic wave supplied from the ultrasonic nozzle reaches the cleaning brush. Namely, in this structure, the cleaning brush is subjected to the ultrasonic cleaning only in the state where the substrate is set in the cleaning apparatus. Therefore, the particulate contamination (dust particles) removed from the cleaning brush may be redeposited onto the surface of the substrate, which in turn contaminates the substrate surface.

In summary, the cleaning apparatus of Japanese Unexamined Patent Publication No. 86222/1995 has the following deficiencies.
1. Firstly, only the part surrounding the cleaning brush is cleaned ultrasonically, and the part to be brush-cleaned on the substrate surface is hardly cleaned ultrasonically. Namely, although the cleaning brush and the ultrasonic nozzle are driven at the same time, the brush cleaning and ultrasonic cleaning never be applied to the same part simultaneously. Therefore, the foregoing cleaning apparatus cannot provide a sufficient level of cleanliness to meet the increasing demand for cleaning of an improved precision (fineness).
2. Secondly, cleaning of the cleaning brush by the ultrasonic nozzle is performed only on its side face of the cleaning brush, not in the central portion thereof.
3. Thirdly, the cleaning of the cleaning brush is performed only in the state where the substrate is set in the cleaning apparatus, and thus the particulate contamination (dust particles) once captured by the cleaning brush is liable to redeposite on the substrate.

In order to overcome the foregoing problem of the contamination of the cleaning brush associated with the structure wherein the cleaning of the cleaning brush is performed in the cleaning vessel, a substrate cleaning apparatus wherein an overflow vessel which stores therein a ultrasonic vibrator is adopted as the cleaning vessel has been proposed.

Further, Japanese Unexamined Patent Publication No. 5577/1994 discloses the brush cleaning structure wherein an overflow vessel which stores therein an ultrasonic vibrator is provided for soaking therein the cleaning brush and the substrate. With this structure, the cleaning brush and the substrate are always subjected to cleaning.

However, in the foregoing cleaning structure of soaking the cleaning brush and the substrate, compared with the case of blowing the aqueous cleaning agent through the nozzle, the flow of the cleaning agent is slow. Therefore, the aqueous cleaning agent in this cleaning structure of soaking is liable to stay in the overflow vessel, and dust particles as removed from the substrate float on the surface of the aqueous cleaning agent. Furthermore, due to this gentle flow of the aqueous cleaning agent, the dust particles are liable to float on the surface of the aqueous cleaning agent without being discharged, and such dust particles floating on the surface of the aqueous cleaning agent may redeposite on the surface of the substrate, which causes a serious problem in cleaning the substrate. Therefore, with the foregoing structure, although a deterioration in cleaning brush overtime may be suppressed, the substrate cannot be cleaned at a sufficient level of cleanliness. Therefore, the foregoing cleaning apparatus cannot provide a sufficient level of cleanliness to meet the increasing demand for cleaning of an improved precision (fineness).

Furthermore, according to the above structure, the cleaning brush is always washed, and for this reason, the aqueous cleaning agent cannot be kept clean as being always contaminated with the dust particles as removed from the cleaning brush. As a result, the precision cleaning cannot be performed at a sufficient level of cleanliness.

In summary, the cleaning apparatus of Japanese Unexamined Patent Publication No. 5577/1994 has the following deficiencies:
1. Firstly, since the cleaning brush and the substrate are soaked in the aqueous cleaning agent, the dust particles as removed from the substrate are liable to float on the surface of the aqueous cleaning agent, and redeposite onto the surface of the substrate. Therefore, although the deterioration of the cleaning brush over time may be suppressed to some extent, the cleaning power for the substrate would be lowered on the contrary. Therefore, the foregoing cleaning apparatus cannot provide a sufficient level of cleanliness to meet the increasing demand for cleaning of an improved precision (fineness).
2. Secondly, as the cleaning brush is always subjected to cleaning, the aqueous cleaning agent cannot be kept clean. It is therefore not possible to perform precision cleaning at a sufficient level of cleanliness.

SUMMARY OF THE INVENTION

It is an object of the present invention to provide a cleaning apparatus which permits a precision cleaning of an object to be cleaned with simplified maintenance operations, and which permits a reduced foot print area.

In order to achieve the above object, a cleaning apparatus of the present invention is characterized by comprising:
  scrubbing means for scrubbing a surface of an object to be cleaned; and
  ultrasonic wave projection means for supplying an aqueous cleaning agent against the surface of the object to be cleaned and generating an ultrasonic wave,
  wherein the scrubbing means and the ultrasonic wave projection means are provided so as to oppose one another, and
  the object to be cleaned is to be set between the scrubbing means and the ultrasonic wave projection means.

According to the foregoing structure, the scrubbing cleaning by the scrubbing means and the ultrasonic cleaning with an ultrasonic wave propagated from the ultrasonic wave projection means through the object to be cleaned are applied to the part to be scrubbed with the scrubbing means on the surface of the object to be cleaned simultaneously. By applying the scrubbing cleaning and the ultrasonic cleaning to the same part on the surface of the object to be cleaned, precision cleaning can be performed at a sufficient level of cleanliness.

According to the foregoing structure, the scrubbing means can be ultrasonically cleaned by the scrubbing means in a state where the object to be cleaned is not set in the cleaning apparatus by applying thereto the aqueous cleaning agent and the ultrasonic wave from the ultrasonic wave projection means. It is therefore possible to maintain the scrubbing means clean without taking it out from the cleaning apparatus, and thus troublesome maintenance operations can be omitted. Furthermore, since the scrubbing means is subjected to cleaning in the state where the object to be cleaned is not set in the cleaning apparatus, the likelihood of such problem that the particulate contamination (dust particles) once removed out of the scrubbing means are redeposited onto the object to be cleaned can be prevented, which is liable to occur when cleaning the scrubbing means in the state where the object to be cleaned is set in the cleaning apparatus.

Furthermore, in the foregoing structure, by integrating the scrubbing means and the ultrasonic wave projection means in one part, an overall footprint area of the cleaning apparatus can be reduced.

Therefore, according to the foregoing structure of the cleaning apparatus, precision cleaning of both the object to be cleaned and the scrubbing means can be performed at high level of cleanliness, and at the same time, an overall foot print area can be reduced.

For a fuller understanding of the nature and advantages of the invention, reference should be made to the ensuing detailed description taken in conjunction with the accompanying drawings.

DESCRIPTION OF THE EMBODIMENTS

First Embodiment

Figure 1:
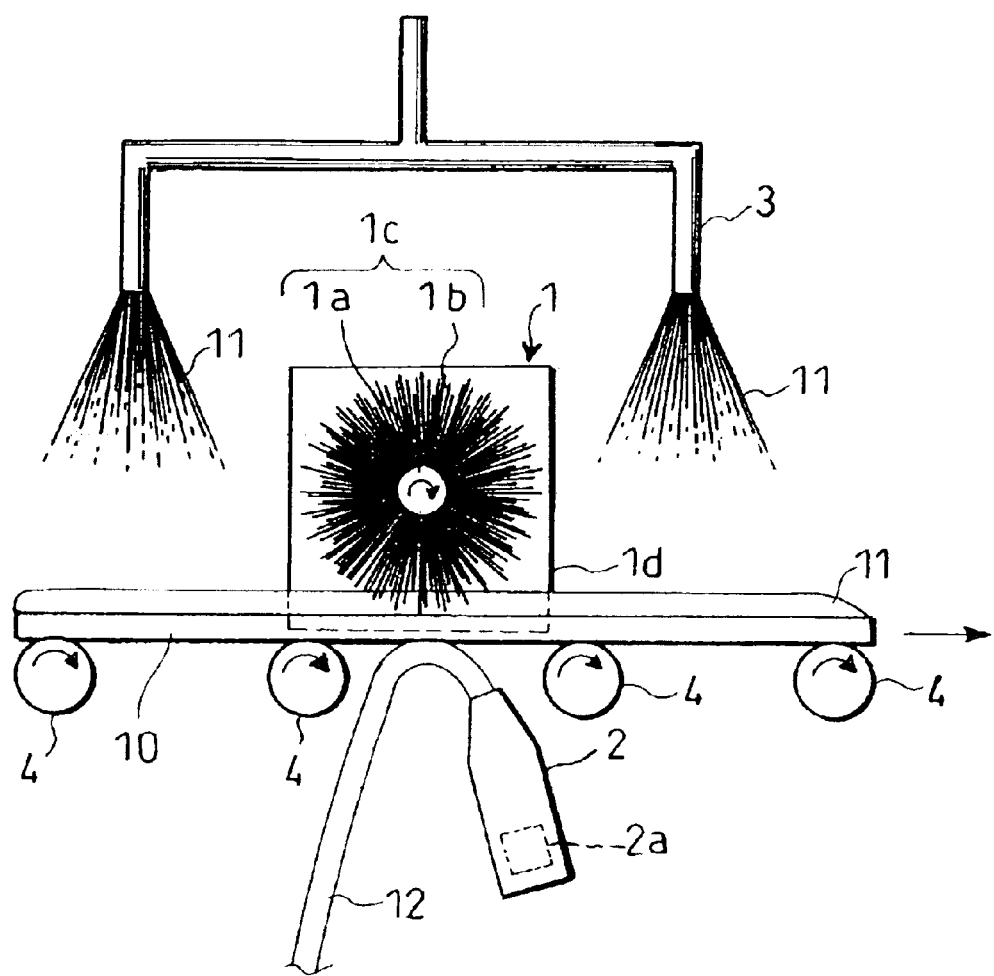
FIG. 1 is a side view illustrating a cleaning apparatus in accordance with one embodiment of the present invention.
Figure 2:
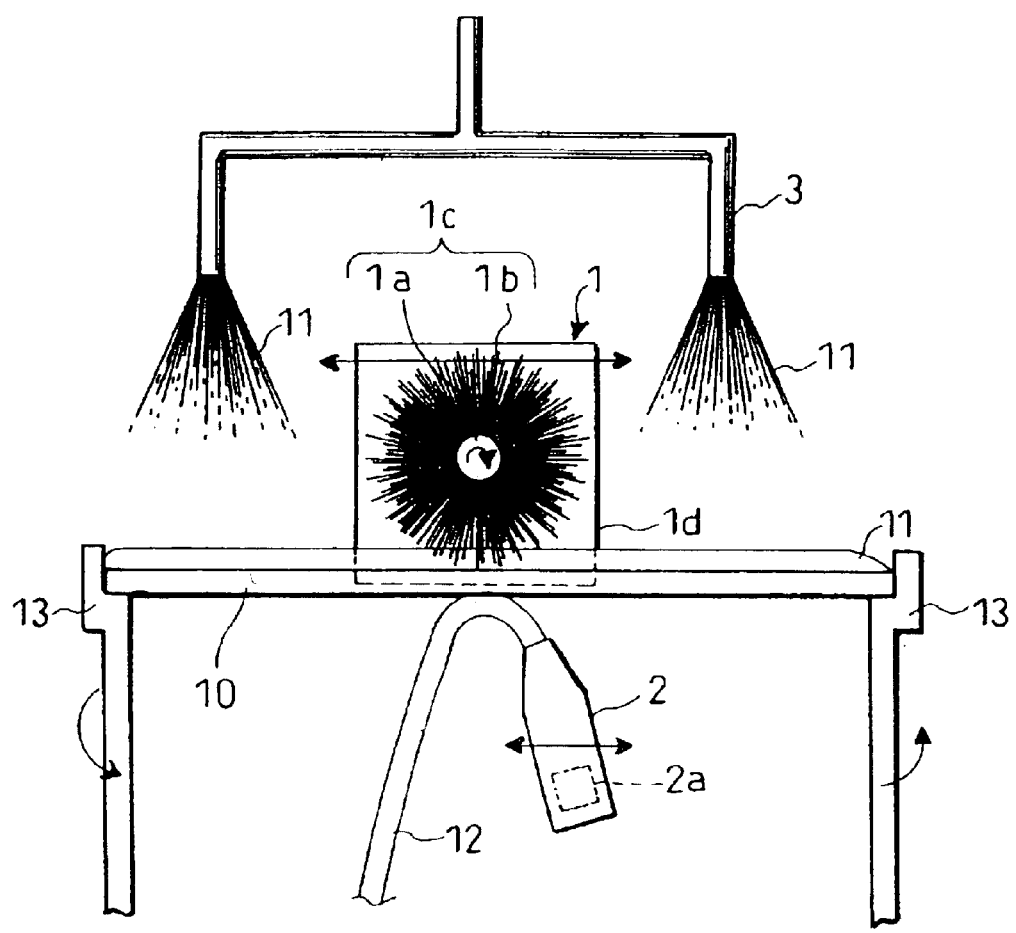
FIG. 2 is a side view illustrating one modified example of the cleaning apparatus of FIG. 1.
Figure 3:
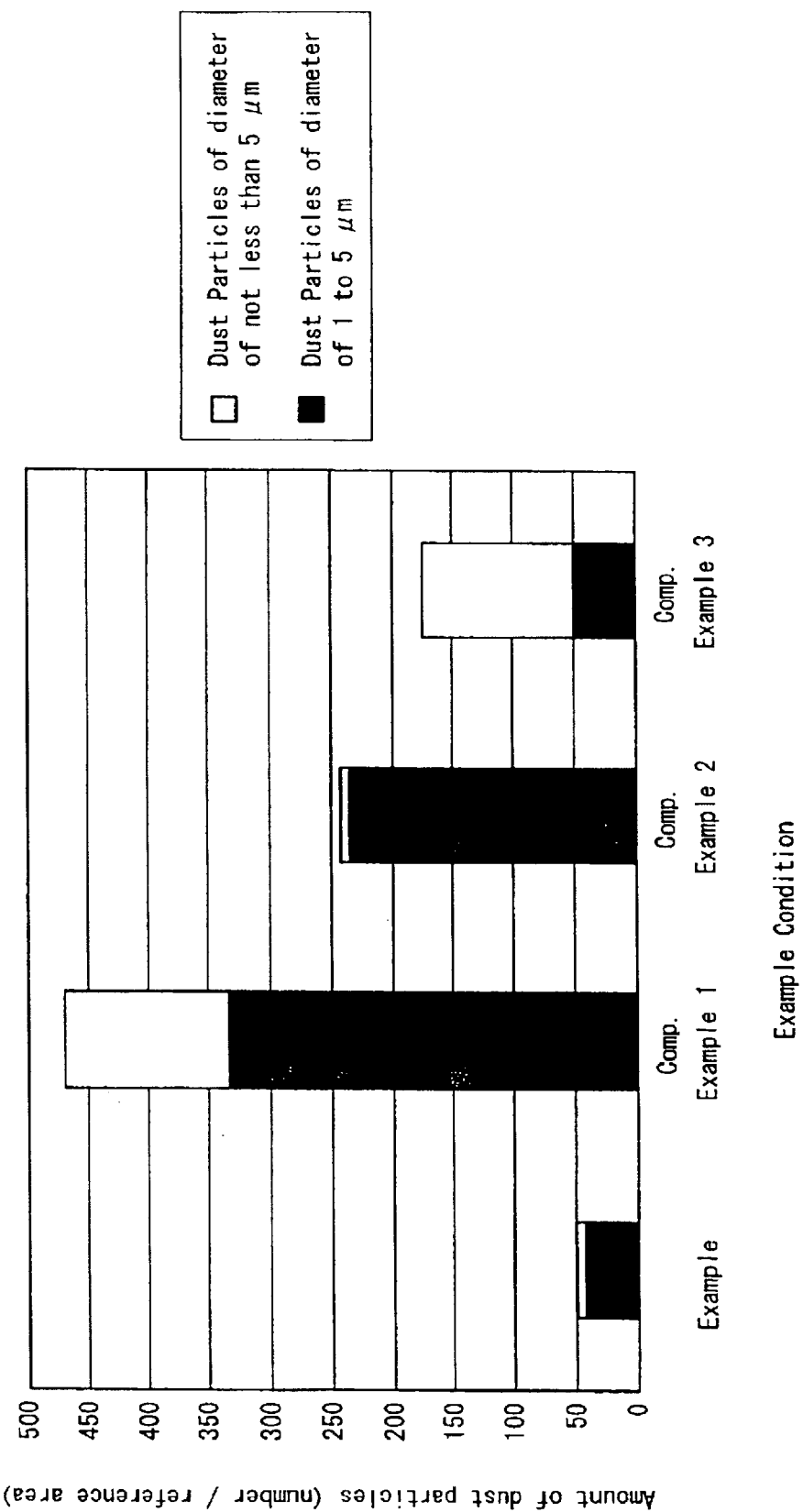
FIG. 3 is a graph showing results of experiments on cleaning.

The following will explain one embodiment of the present invention with reference to FIG. 1 through FIG. 3.

As illustrated in FIG. 1, a cleaning apparatus of the present embodiment includes a roll brush (cleaning brush, scrubbing means) 1, an ultrasonic nozzle 2 (ultrasonic wave projection means) for ultrasonic cleaning, shower nozzles (sprayer, cleaning agent supply means) 3, and transport rollers (transport means) 4. The roll brush 1 is provided for brush cleaning a substrate 10 as an object to be cleaned such as a glass substrate, a semiconductor wafer or the like. The roll brush 1 and the ultrasonic nozzle 2 are provided so as to oppose each other. The shower nozzles 3 are provided for supplying an aqueous cleaning agent 11 onto the substrate 10 for shower-cleaning. The transport rollers (transport means) 4 are provided for transporting the substrate 10 in the horizontal direction while maintaining the surface of the substrate 10 horizontal.

As shown in FIG. 1, the roll brush 1 includes a cylindrical brush part 1c in which a large number of fabric 1b made of polyamide (nylon) are flocked radially on a surface of a core member 1a, and a rotation drive unit (rotation mechanism) 1d to be connected to the core member 1a for rotating the brush part 1c. The roll brush 1 is arranged such that the core member 1a is positioned parallel to the plane of the substrate, and that the fabric 1b makes a contact with the upper surface of the substrate 10. The roll brush 1 scrubs the upper surface (the surface to be cleaned) of the substrate 10 with the brush part 1c that is rotated by the rotation drive unit 1d, so as to perform a brush-cleaning (brush scrubbing cleaning) of the upper surface of the substrate 10.

In the present embodiment, by adopting the roll brush 1 as the cleaning brush, cleaning of the substrate 10 can be performed more desirably as the likelihood of such problem that the particulate contamination (dust particles) once captured by the brush part 1c is redeposited onto the upper surface of the substrate 10 can be suppressed. Specifically, according to the structure of the present embodiment, immediately after scrubbing the upper surface of the substrate 10, the fabric 1b is rinsed with the aqueous cleaning agent 11, and therefore the upper surface of the substrate 10 can be always scrubbed sequentially with the fabric 1b just rinsed with the aqueous cleaning agent 11.

The brush part 1c of the roll brush 1 is formed in length slightly longer than the length, in the lengthwise direction of the brush part 1c, of the substrate 10 to be cleaned. Here, it is desirable that the brush part 1c of the roll brush 1 rotates in the direction of scrubbing the substrate 10 in an opposite direction to the transport direction of the substrate 10 so that the effect of cleaning can be improved. It is desirable that the rotating direction of the brush part 1c of the roll brush 1 be set so as to scrub the substrate 10 in an opposite direction to the transport direction of the substrate 10 so that the effect of cleaning can be improved. Namely, it is desirable that the rotation direction of the brush part 1c of the roll brush 1 be set in the rotation direction of the transport rollers 4. In this way, the relative speed between the roll brush 1 and the surface of the substrate 10 can be increased, which in turn improves the effect of cleaning.

The ultrasonic nozzle 2 is arranged so as to spray the aqueous cleaning agent 12 against the center of the roll brush 1. The ultrasonic nozzle 2 stores therein an ultrasonic vibrator 2a for applying ultrasonic wave onto the center of the roll brush 1.

Therefore, in the state where the substrate 10 is set in the cleaning apparatus, the ultrasonic nozzle 2 blows the aqueous cleaning agent 12 against the lower surface (back surface) of the substrate 10, and in the meantime applies ultrasonic vibrations to the aqueous cleaning agent 12. In this way, by applying the ultrasonic wave to the lower surface of the substrate 10 to be propagated to the upper surface, not only the lower surface but also the upper surface of the substrate 10 can be ultrasonically cleaned. On the other hand, in the state where the substrate 10 is not set in the cleaning apparatus, the ultrasonic nozzle 2 applies the aqueous cleaning agent 12 to the roll brush 1, and in the meantime, applies ultrasonic wave to the aqueous cleaning agent 12 for the ultrasonic cleaning of the roll brush 1.

The ultrasonic vibrator 2a is not particularly limited, and, for example, those made of ferrite, piezoelectric ceramics or the like may be adopted. For the ultrasonic wave to be generated from the ultrasonic vibrator 2a, it is preferable but not limited to adopt the ultrasonic wave in a frequency band within the range of from 850 kHz to 1 MHz called "megasonic". In this way, the vibrations of the aqueous cleaning agent 12 can be greatly accelerated when cleaning without generating cavitation impact, thereby permitting dust particles of sub-micron order (particulate contamination) to be removed from the object to be cleaned without damaging it.

The ultrasonic nozzle 2 may be arranged so as to reciprocate along the lengthwise direction of the brush part 1c of the roll brush 1. However, for the structure wherein the object to be cleaned is transported in the horizontal direction as in the present embodiment, it is preferable to adopt the ultrasonic nozzle 2 of a length (for example, 400 mm), in the lengthwise direction of the brush part 1c, of the object to be cleaned and to mount such ultrasonic nozzle 2 so as to be extended in the lengthwise direction of the brush part 1c of the roll brush 1 as the mechanism for moving the ultrasonic nozzle 2 can be omitted.

The shower nozzles 3 are provided for i) supplying the aqueous cleaning agent 11 uniformly onto the upper surface of the substrate 10 by radially blowing the aqueous cleaning agent 11 against the upper surface so as to cover the entire upper surface of the substrate 10, and ii) shower-cleaning the upper surface of the substrate 10 in a large area. With the foregoing means for uniformly supplying the aqueous cleaning agent 11 onto the entire upper surface of the substrate 10, the brush cleaning and the ultrasonic cleaning can be performed effectively. Moreover, as the contaminants as removed from the upper surface of the substrate 10 can be rinsed off quickly with the aqueous cleaning agent 11, such problem that the contaminations once removed from the upper surface of the substrate 10 are redeposited thereon can be prevented.

Generally, the same agent is used for the aqueous cleaning agent 11 to be supplied onto the upper surface of the substrate 10, and for the aqueous cleaning agent 12 to be supplied to the lower surface of the substrate 10. Non-limited examples of such agent include: pure water, superpure water, hydrogen water, ozone water, dilute hydrofluoric acid, aqueous surface active agent, etc.

The transport rollers 4 transport the substrate 10 at a constant rate along the horizontal surface in a direction perpendicular to the axis of rotation of the core member 1a of the roll brush 1 while rotating on the lower surface of the substrate 10. With this transportation, the entire surface of the substrate 10 can be cleaned entirely without moving the roll brush 1 or the ultrasonic nozzle 2 in the transport direction of the substrate 10. In this case, it is not necessary to move the roll brush 1, and, as for the ultrasonic nozzle 2, it is only required to move it in a direction that is perpendicular to the transport direction of the substrate 10. Therefore, a complicated moving mechanism such as a robot arm for moving the roll brush 1 and the ultrasonic nozzle 2 interlocking with each other in the direction as desired can be omitted, thereby realizing a simplified moving structure. Moreover, it is arranged such that the transport rollers 4 can convey a plurality of substrates 10 between the roll brush 1 and the ultrasonic nozzle 2 successively, so that a plurality of substrates 10 can be cleaned successively. Here, it may be arranged so as to transport the substrate 10 by independently performing the step of transporting it into the space formed between the roll brush 1 and the ultrasonic nozzle 2 and the step of transporting it out of the space.

In the case of cleaning the plurality of substrates 10 successively, it is preferable to arrange such that the substrates 10 be supplied one by one at a constant interval by a loader from a dedicated cassette, which is capable of storing a plurality of substrates 10. In this way, ultrasonic cleaning of the roll brush 1 can be performed by the ultrasonic nozzle 2 between the cleaning of the two substrates 10, and the roll brush 1 can be always kept clean.

As described, according to the cleaning apparatus of the present embodiment, the roll brush 1 and the ultrasonic nozzle 2 are provided so as to oppose one another. The roll brush 1 is provided above the substrate 10, and the ultrasonic nozzle 2 is provided below the substrate 10, and the aqueous cleaning agent 11 is supplied to the roll brush 1 and the upper surface of the substrate 10. In this way, the part in contact with the roll brush 1 of the upper surface of the substrate 10 is brush-cleaned with the roll brush 1 which is wet with the aqueous cleaning agent 11. Moreover, the part on the upper surface of the substrate 10, which is to be brush-cleaned with the roll brush 1 is ultrasonically cleaned at the same time with ultrasonic vibrations which have been supplied through the ultrasonic nozzle 2 and propagated from the lower surface of the substrate 10. Therefore, the brush cleaning by means of the roll brush 1 and the ultrasonic cleaning by means of the ultrasonic nozzle 2 can be applied to the same part on the substrate 10 simultaneously.

Furthermore, according to the cleaning apparatus of the present embodiment, shower-cleaning is applied to a large area on the upper surface of the substrate 10 by means of the shower nozzles 3. It is therefore possible to achieve the synergetic effects from a combination of three different cleaning systems, i.e., the brush-cleaning, the ultrasonic cleaning and the shower-cleaning with respect to the upper surface of the substrate 10, thereby permitting the precision cleaning of the upper surface of the substrate 10 to be performed at a sufficient level of cleanliness. Specifically, with the brush cleaning, particularly the particulate contamination of a particle diameter of not less than 5 $\mu$m, adhering onto the object to be cleaned can be removed effectively; with the ultrasonic cleaning, particularly the particulate contamination of a particle diameter of not more than 5 $\mu$m can be removed effectively: and with the shower-cleaning, the contaminants as removed can be discharged quickly.

On the lower surface of the substrate 10, only the ultrasonic cleaning is applied. However, as necessary, it may be arranged such that the cleaning apparatus be provided with the reverse mechanism for turning over the substrate 10, so as to apply the precision cleaning in combination of three different cleaning systems to both surfaces of the substrate 10. Here, the structure of the reverse mechanism is not particularly limited.

Moreover, according to the cleaning apparatus of the present embodiment, the roll brush 1 and the ultrasonic nozzle 2 are arranged so as to oppose one another, and the substrate 10 is transported in a spacing between the roll brush 1 and the ultrasonic nozzle 2. In this structure, the roll brush 1 can be subjected to the ultrasonic cleaning by the ultrasonic nozzle 2 in the state where the substrate 10 is not set between the roll brush 1 and the ultrasonic nozzle 2.

Here, the following problem is to be considered. The longer the operating time of the cleaning apparatus, the more likely it is that contaminants collected by the cleaning brush are stored therein, which causes contamination of the substrate surface. To prevent the foregoing problem, in the conventional cleaning apparatus, a periodic maintenance is needed for cleaning the cleaning brush, for which it is generally required to stop the operation of the cleaning apparatus and perform troublesome operations.

In contrast, according to the cleaning apparatus of the present embodiment, the roll brush 1 can be cleaned automatically by the ultrasonic nozzle 2 in the state where the substrate 10 is not set between the roll brush 1 and the ultrasonic nozzle 2. For example, in the case of successively transporting a plurality of substrates 10, the roll brush 1 can be cleaned by the ultrasonic nozzle 2 between the two substrates 10, or when no substrate 10 is being transported (directly before or after the cleaning is performed). According to the foregoing structure of the cleaning apparatus, the cleanliness of the roll brush 1 can be always kept at high level, without requiring periodic maintenance operations. Moreover, according to the foregoing structure, the cleaning of the roll brush 1 is not performed in the state where the substrate 10 is set between the roll brush 1 and the ultrasonic nozzle 2, and it is therefore possible to prevent the likelihood of such problem that the contaminants once captured by the roll brush 1 are redeposited onto the substrate 10.

Furthermore, according to the cleaning apparatus of the present embodiment, the roll brush 1 and the ultrasonic nozzle 2 are integrated in one part. It is therefore possible to reduce the size of the cleaning apparatus in the transport direction of the substrate 10, thereby reducing the overall footprint area of the cleaning apparatus.

In summary, the foregoing cleaning apparatus of the present embodiment offers the following effects:

(1) the brush cleaning, the ultrasonic cleaning, and the shower-cleaning can be applied to the same part on the upper surface of the substrate 10 simultaneously, whereby the precision cleaning of the upper surface of the substrate 10 can be performed at a sufficient level of cleanliness;

(2) the precision cleaning of the roll brush 1 can be performed in the state where the substrate 10 is not set in the cleaning apparatus; and (3) an overall footprint area of the cleaning apparatus can be reduced.

Figure 7:
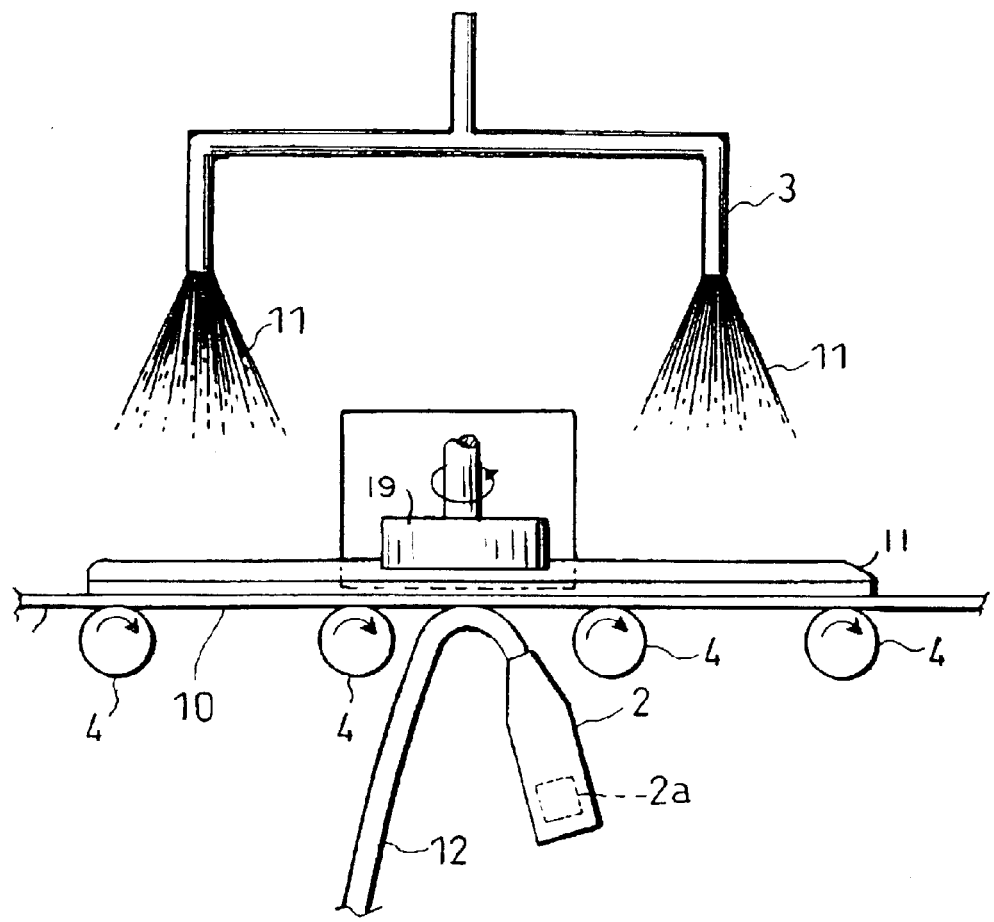
FIG. 7 is a side view illustrating of a cleaning apparatus in accordance with yet another embodiment of the present invention.

In the present embodiment, the roll brush 1 is adopted as the cleaning brush for cleaning the substrate 10. However, the cleaning brush of the present invention is not limited to the roll brush, and for example, in lieu of the roll brush 1, a disk brush 19 (disk-shaped brush) having a rotation mechanism for rotating the disk 19 about the vertical rotation axis, which is to say rotation in a plane parallel to the plane of the substrate 10, may be adopted. See, e.g., FIG. 7. In the case of adopting the disk brush 19, it is preferable that the horizontal moving mechanism be provided for moving the disk brush 19 in the horizontal direction along the surface of the substrate 10 so that the entire surface of the substrate 10 can be cleaned.

In the present embodiment, the transport rollers 4 are adopted for transporting the substrate 10. However, the transport means of the present invention is not particularly limited to the transport rollers 4, and for example, a belt conveyer 15 may be adopted. See, e.g., FIG. 7. However, in order to effectively clean the upper surface of the substrate 10, it is preferable that the transport means for transporting the substrate 10 be arranged so as to transport the substrate 10 in a direction parallel to the upper surface (surface to be cleaned) of the substrate 10 between the roll brush 1 and the ultrasonic nozzle 2, i.e., in the horizontal direction.

Alternately, the rotation drive means for rotating the substrate 10 may be adopted in replace of the transport means for transporting the substrate 10. Specifically, for example, as illustrated in FIG. 2, an arm (rotation mechanism) 13 which rotates the substrate 10 about the rotation axis vertical to the substrate 10 while supporting the substrate 10 only with its circumferential portion may be provided. In this case, the roll brush 1 and the ultrasonic nozzle 2 reciprocate in the horizontal direction. In the case of adopting the disk brush, it is preferable that the rotation drive means for rotating the substrate 10 be provided, as an improved cleaning efficiency can be achieved.

In the present embodiment, as cleaning agent supply means for supplying the aqueous cleaning agent 11 to a part on the upper surface of the substrate 10, which makes a contact with the roll brush 1, the shower nozzle 3 are adopted. However, the cleaning agent supply means of the present invention is not necessarily limited to this, and for example, in replace of shower nozzles 3, a slit type nozzle for spraying the aqueous cleaning agent 11 from above the roll brush 1 or a nozzle for applying therethrough the aqueous cleaning agent 11 downwards onto the upper surface of the substrate 10 may be adopted.

In the present invention, explanations have been given through the case of cleaning the substrate 10 as an object to be cleaned. However, the object to be cleaned of the present invention is not limited to this. The cleaning apparatus of the present invention is applicable to the cleaning of other objects, non-limited examples of which include: a stick like object such as optical fiber, etc. However, the smaller is the size of the object to be cleaned along the line connecting the roll brush 1 and the ultrasonic nozzle 2 in a direction vertical to the transport direction, ultrasonic vibrations from the ultrasonic nozzle 2 can be applied more effectively onto the surface of the object to be cleaned on the side of the roll brush 1, and the particular effects as achieved from the present invention can be more appreciated. For this reason, the cleaning apparatus of the present invention effectively works for the cleaning of an object whose size is small at least in one direction, particularly for the cleaning of an object in thickness of not more than 2 mm.

Experiments were conducted on the effects of cleaning of the substrate 10 using the cleaning apparatus of the present embodiment. In the example, an experiment on the effects of cleaning was conducted by carrying out the shower-cleaning, the brush cleaning and the ultrasonic cleaning in combination. For comparison with the Example, comparative examples 1 to 3 were performed wherein respective experiments were conducted without carrying out at least one of the shower cleaning, the brush cleaning and the ultrasonic cleaning. In the foregoing example and comparative examples 1 to 3, pure water was adopted for the aqueous cleaning agent, and a roll brush made of polyamide (nylon) was adopted for the cleaning brush. The results on the effects of cleaning are indicated by the numbers of the particulate contamination (dust particles) remaining on the upper surface of the substrate 10 per reference area (170,000 mm$^2$) by classifying them into i) those having a particle diameter within the range of from 1 $\mu$m to 5 $\mu$m and ii) those having a particle diameter of not less than 5 $\mu$m. In the initial state, i.e., before the experiments were conducted, the dust particles having a particle diameter within the range of from 1 $\mu$m to 5 $\mu$m and the dust particles having a particle diameter of not less than 5 $\mu$m remained on the upper surface of the substrate 10 were in the number from 400 to 450, and from 200 to 250 respectively. The respective conditions and the results of experiments are shown in Table 1 and Table 2 below. Further, the results shown in Table 2 are plotted in the graph of FIG. 3.

TABLE 1

Experiment Conditions

|  | Example | Comp. Example 1 | Comp. Example 2 | Comp. Example 3 |
|---|---|---|---|---|
| Shower Cleaning | applied | applied | applied | applied |
| Brush Cleaning | applied | not applied | applied | not applied |
| Ultrasonic Cleaning | applied | not applied | not applied | applied |

TABLE 2

Results on Effects of Cleaning

|  | Example | Comp. Example 1 | Comp. Example 2 | Comp. Example 3 |
|---|---|---|---|---|
| Dust Particles of diameter of 1 to 5 $\mu$m | 39 | 332 | 228 | 46 |
| Dust Particles of diameter of not less than 5 $\mu$m | 9 | 140 | 12 | 131 |

It can be seen from the results shown in the above Tables 1 and 2, as a result of conducting the precision cleaning of the Example, reduction in amount of dust particles was observed both for the dust particles having a particle diameter within the range of from 1 to 5 $\mu$m and the dust particles having a particle diameter of not less than 5 $\mu$m. The results therefore proves that the cleaning apparatus of the present embodiment realizes the cleaning of the substrate 10 at a sufficient level of cleanliness in very efficient manner.

In comparative example 1, neither the brush cleaning nor the ultrasonic cleaning were performed. The results of this comparative example 1 show that as a result of performing a cleaning operation of the comparative example 1, only small reduction in an amount of dust particles is observed both for the dust particles having a particle diameter within the range of from 1 to 5 $\mu$m and the dust particles having a particle diameter of not less than 5 $\mu$m from the initial state, and the cleaning of the substrate 10 at a sufficient level of cleanliness cannot be achieved.

In the comparative example 2, the ultrasonic cleaning was not performed. The results of this comparative example 2 show that a small reduction in amount of dust particles remaining on the surface of the substrate 10 is observed for those having a particle diameter of not less than 5 $\mu$m, however, a reduction in amount of dust particles having a particle diameter within the range of from 1 $\mu$m to 5 $\mu$m is hardly observed, and the effect of cleaning of the substrate 10 at a sufficient level of cleanliness cannot be achieved. Furthermore, the level of cleanliness obtained in this comparative example 2 is much lower than that of the example, as a larger amount of dust particles remains on the substrate 10 even for those having a particle diameter of not less than 5 $\mu$m.

In comparative example 3, the brush scrubbing cleaning was not performed. The results of this comparative example 3 show that although a small reduction in amount of dust particles remaining on the surface of the substrate 10 is observed for those having a particle diameter within the range of from 1 $\mu$m to 5 $\mu$m, a reduction in amount of dust particles having a particle diameter of not less than 5 $\mu$m is hardly observed, and the cleaning of the substrate 10 at a sufficient level of cleanliness cannot be achieved. Furthermore, the level of cleanliness obtained in the comparative example 3 was much lower than that of the Example, as a larger amount of dust particles remained on the substrate 10 even for those having a particle diameter within the range of from 1 to 5 $\mu$m.

In view of the foregoing results of experiment, it is clear that the cleaning apparatus of the present embodiment permits the precision cleaning of the substrate 10 at an excellent level of cleanliness. Namely, according to the cleaning apparatus of the present embodiment, the synergistic effects of three different cleaning systems can be achieved, and the precision cleaning of the upper surface of the substrate 10 can be performed at a sufficient level of cleanliness.

According to the cleaning apparatus of the present embodiment, the ultrasonic cleaning is performed by supplying the aqueous cleaning solution 12 having applied thereto the ultrasonic wave to the lower surface (back surface) of the substrate 10 so that the ultrasonic wave can be propagated to the upper surface of the substrate. As can be seen from the above results (comparison between the Example and the Comparative Examples), with the foregoing ultrasonic cleaning, the dust particles having a particle diameter within the range of from 1 to 5 μm can be removed in an efficient manner.

Second Embodiment

Figure 4:
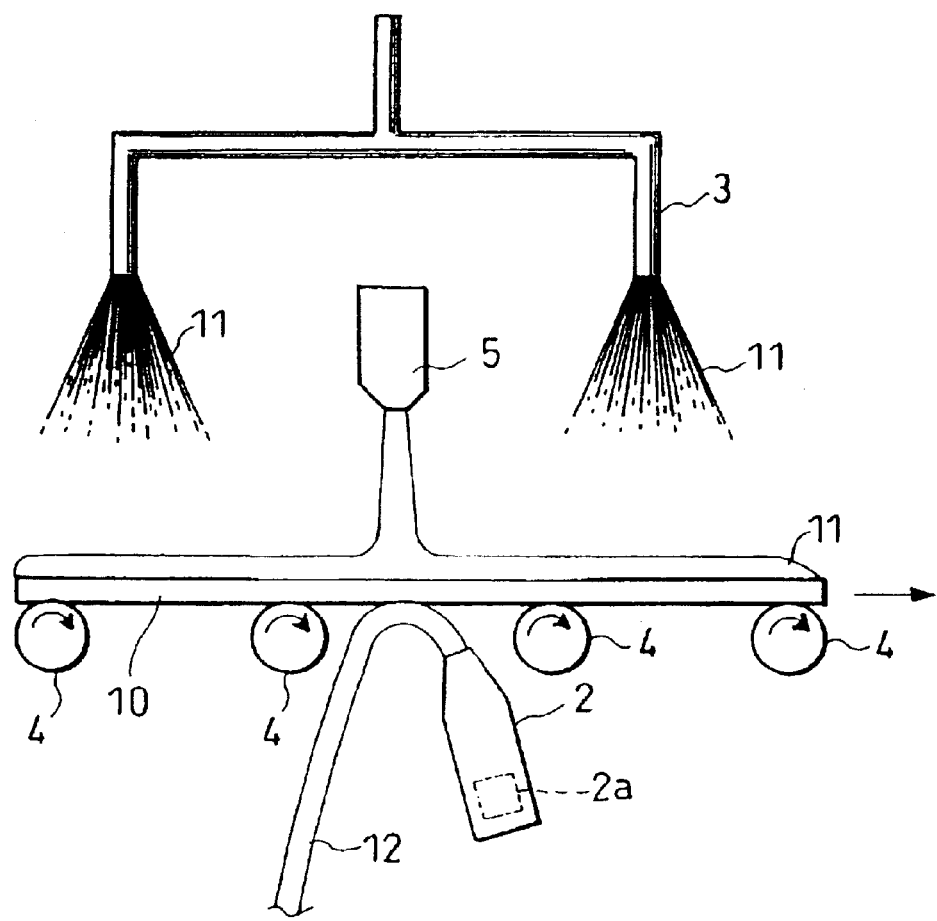
FIG. 4 is a side view illustrating a cleaning apparatus in accordance with another embodiment of the present invention.
Figure 5:
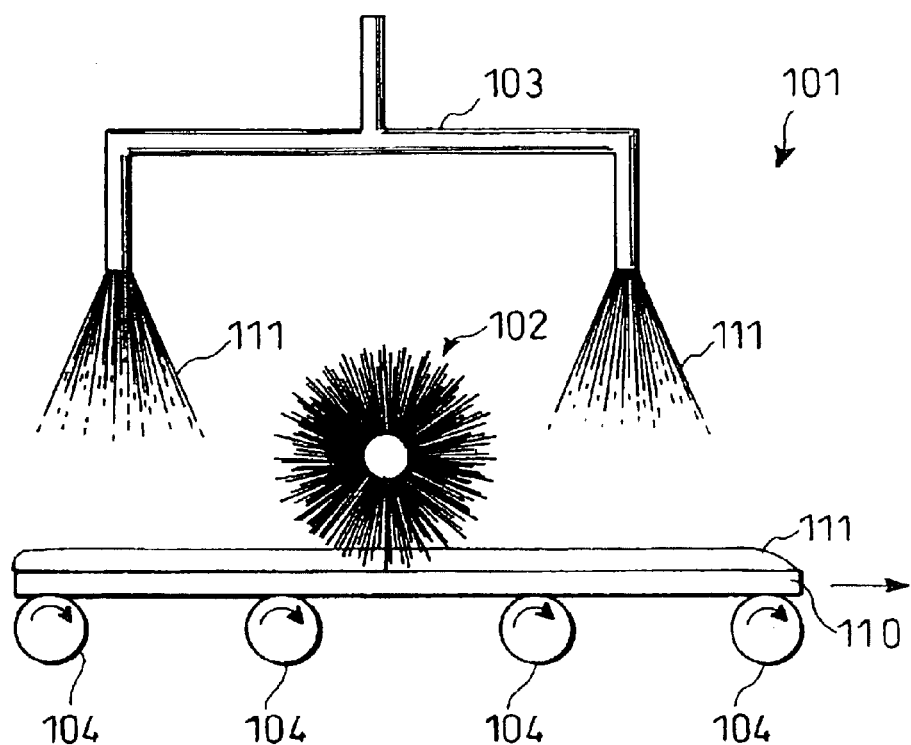
FIG. 5 is a partial side view illustrating a part of a brush cleaning vessel in a conventional cleaning apparatus.
Figure 6:
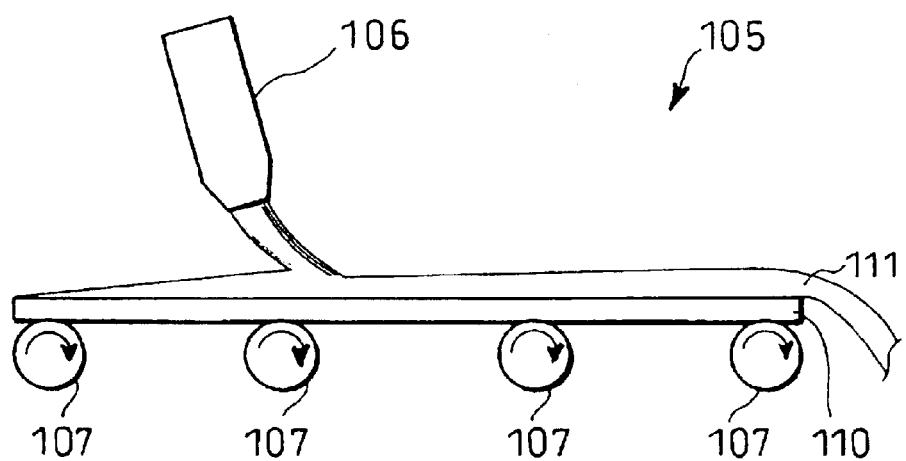
FIG. 6 is a partial side view illustrating a part of an ultrasonic cleaning vessel in a conventional cleaning apparatus.

The following will explain another embodiment of the present invention with reference to FIG. 4. For ease of explanation, members having the same functions as those shown in the drawings pertaining to the first embodiment above will be given the same reference symbols, and explanation thereof will be omitted here.

The cleaning apparatus of the present embodiment as illustrated in FIG. 4 basically has the same structure as the structure of the cleaning apparatus of the preceding first embodiment except for the following. That is, as shown in FIG. 4, the cleaning apparatus of the present embodiment adopts a high pressure spray nozzle 5 (cleaning agent jet-spray means) in replace of the roll brush 1 of the first embodiment. The high pressure spray nozzle 5 is provided so as to oppose the ultrasonic nozzle 2. This high pressure spray nozzle 5 is provided for performing a high pressure spray cleaning with respect to the substrate 10 as an object to be cleaned. In the present embodiment, the shower nozzles 3 are omitted from the structure of the first embodiment.

The high pressure spray nozzle 5 is provided for jet-spraying the aqueous cleaning agent 11 under the pressure of not less than 1960 kN (20 kgf/cm$^2$) so as to generate the jet of the aqueous cleaning agent 11. The high pressure spray nozzle 5 jet-sprays the aqueous cleaning agent against the upper surface of the substrate 10 to form a spot. As a result, the high pressure spray nozzle 5 performs a so-called high pressure spray cleaning wherein the contamination adhering to the upper surface of the substrate 10, particularly the particulate contamination having a particle diameter of not less than 3 μm are separated therefrom and are rinsed off by the collision force and the shear force of the jet. Additionally, the jet from the high pressure spray nozzle 5 hits the upper surface of the substrate 10 at portion where the ultrasonic vibrations from the ultrasonic nozzle 2 are most effectively activated, i.e., the point where the extension line of the jet from the ultrasonic nozzle 2 crosses the upper surface of the substrate 10. As a result, the upper surface of the substrate 10, which is wet with the aqueous cleaning agent, receives ultrasonic vibrations which have been applied to the lower surface of the substrate 10 through the ultrasonic nozzle 2 and propagated thereto from the lower surface, whereby the upper surface of the substrate 10 can be subjected to the high pressure spray cleaning and the ultrasonic cleaning simultaneously.

According to the cleaning apparatus of the present embodiment, the high pressure spray cleaning and the ultrasonic cleaning can be applied to the same part on the upper surface of the substrate simultaneously, and therefore, it is possible to perform the precision cleaning of the surface of the substrate at a sufficient level of cleanliness. Moreover, according to the cleaning apparatus of the present embodiment, the high pressure spray nozzle 5 and the ultrasonic nozzle 2 are integrated in one part, an overall footprint area of the cleaning apparatus can be reduced.

Additionally, in the case of transporting the substrate 10 in the horizontal direction, for the high pressure spray nozzle 5 and the ultrasonic nozzle 2, it is preferable adopt nozzles having the length, corresponding to the length in the direction vertical to the transport direction, of the object to be cleaned provided so as to be extended in the direction vertical to the transport direction of the object to be cleaned and parallel to the surface to be cleaned. For example, for the object in length of 400 mm in the direction vertical of the substrate 10 to the transport direction, it is preferable that a nozzle in length of not less than 400 mm be provided so as to be extended in the direction parallel to the surface of the substrate 10 and vertical to the transport direction of the substrate 10.

It is preferable that the cleaning apparatus of the present invention further includes cleaning agent supply means for supplying an aqueous cleaning agent onto the surface of the object to be cleaned on the side of the cleaning brush, and more preferably includes a spray for radially spraying the aqueous cleaning agent against the surface of the object to be cleaned on the side of the cleaning brush.

As a result, the aqueous cleaning agent can be uniformly supplied onto the entire surface of the object to be cleaned on the side of the cleaning brush, and thus both the brush cleaning and the ultrasonic cleaning can be performed effectively. Moreover, by immediately rinsing off the contamination as removed from the surface of the object to be cleaned, the likelihood of such problem that the particulate contaminant (dust particles) once captured by the cleaning member is redeposited on the substrate can be eliminated. As a result, precise cleaning can be performed with still improved precision.

It is preferable that the cleaning apparatus of the foregoing structure be further arranged such that the cleaning brush be provided above the object to be cleaned, and the surface of the object to be cleaned is kept horizontal. As a result, an uniform layer of the aqueous cleaning agent can be formed on the surface of the object to be cleaned on the side of the cleaning brush, and it is therefore possible to perform the brush cleaning and the ultrasonic cleaning in more efficient manner.

Another cleaning apparatus of the present invention which includes a high pressure spray nozzle for jet-spraying the aqueous cleaning agent against the surface of the object to be cleaned under high pressure, and an ultrasonic nozzle for spraying the cleaning agent solution against the surface of the object to be cleaned and for generating ultrasonic wave may be arranged such that the high pressure spray nozzle and the ultrasonic nozzle are provided so as to face one another, and the object to be cleaned is set in the space between the high pressure spray nozzle and the ultrasonic nozzle.

According to the foregoing structure, i) the high pressure spray cleaning by means of the high pressure spray nozzle and ii) the ultrasonic cleaning with the ultrasonic wave which has been applied through the ultrasonic nozzle and propagated to the object to be cleaned can be simultaneously applied to the part on the surface of the object to be cleaned where the aqueous cleaning agent as sprayed from the high pressure nozzle hits, thereby permitting a precision cleaning to be performed at a sufficient level of cleanliness. Moreover, in the foregoing structure, the high pressure spray nozzle and the ultrasonic nozzle are integrated in one part. It is therefore possible to reduce an overall footprint area of the cleaning apparatus. Moreover, by adopting the high pressure spray nozzle in replace of the cleaning brush, maintenance operations cannot be omitted.

In this specification, "high pressure jet spray" indicates a jet spray under the pressure of not less than 1960 kN (20 kgf/cm²).

In each of the foregoing structures, it is preferable that the transport means for transporting the object to be cleaned be provided.

In the foregoing structure, a plurality of objects to be cleaned pass through the cleaning space (in a space between the cleaning brush and the ultrasonic nozzle, or a space between the high pressure spray nozzle and ultrasonic nozzle) successively. It is therefore possible to clean a plurality of substrates successively. As a result, precision cleaning can be performed in an efficient manner.

It is also preferable that the cleaning brush include a rotation mechanism for increasing the relative speed between the leading end of the cleaning brush and the surface of the object to be cleaned to be improved.

The invention being thus described, it will be obvious that the same may be varied in many ways. Such the spirit and scope of the invention, and all such modification as would be obvious to one skilled in the art are intended to be included within the scope of the following claims.

What is claimed is:

1. A cleaning apparatus comprising:
   scrubbing means for scrubbing a first surface of an object to be cleaned; and
   ultrasonic wave projection means for supplying an aqueous cleaning agent against a second surface of the object to be cleaned and generating an ultrasonic wave,
   wherein the first surface and the second surface are disposed on opposing sides of the object to be cleaned so that the object to be cleaned is between said scrubbing means and said ultrasonic wave projection means, so that the scrubbing means is in registration with the first surface of the object to be cleaned and the ultrasonic wave projection means is in registration with the second surface of the object to be cleaned,
   wherein the first surface of the object to be cleaned is simultaneously cleaned by the scrubbing means and by the ultrasonic wave generated by the ultrasonic wave projection means that has propagated from the first surface, through the object to be cleaned to the second surface.

2. The cleaning apparatus as set forth in claim 1, further comprising:
   cleaning agent supply means for supplying an aqueous cleaning agent onto the first surface of the object to be cleaned.

3. The cleaning apparatus as set forth in claim 2, wherein:
   said cleaning agent supply means is a spray for radially spraying the aqueous cleaning agent.

4. The cleaning apparatus as set forth in claim 1, further comprising:
   transport means for transporting the object to be cleaned.

5. The cleaning apparatus as set forth in claim 4, wherein:
   said transport means is transport rollers.

6. The cleaning apparatus as set forth in claim 4, wherein:
   said transport means is a belt conveyer.

7. The cleaning apparatus as set forth in claim 1, wherein:
   said scrubbing means is a cleaning brush.

8. The cleaning apparatus as set forth in claim 7, wherein:
   said cleaning brush is a roll brush.

9. The cleaning apparatus as set forth in claim 7, wherein:
   said cleaning brush is a disk brush.

10. The cleaning apparatus as set forth in claim 1, wherein:
    said ultrasonic wave projection means is an ultrasonic nozzle for blowing the cleaning agent and generating an ultrasonic wave.

11. The cleaning apparatus as set forth in claim 1, wherein:
    said ultrasonic wave is megasonic in a frequency band within a range of from 850 kHz to 1 MHz.

12. The cleaning apparatus as set forth in claim 1, wherein:
    said aqueous cleaning agent is at least one of pure water, superpure water, hydrogen water, ozone water, dilute hydrofluoric acid, and aqueous surface active agent.

13. The cleaning apparatus as set forth in claim 1, further comprising:
    a reverse mechanism for turning over the object to be cleaned.

14. The cleaning apparatus as set forth in claim 1, further comprising:
    a rotation mechanism for rotating the object to be cleaned.

15. The cleaning apparatus as set forth in claim 14, wherein:
    said rotation mechanism rotates the object to be cleaned about a rotation axis vertical to the object while supporting its peripheral portion.

16. A cleaning apparatus comprising:
    scrubbing means for scrubbing a first surface of an object to be cleaned; and
    ultrasonic wave projection means for supplying an aqueous cleaning agent against a second surface of the object to be cleaned and generating an ultrasonic wave,
    wherein the first surface and the second surface are disposed on opposing sides of the object to be cleaned so that the object to be cleaned is between said scrubbing means and said ultrasonic wave projection means, so that the scrubbing means is in registration with the first surface of the object to be cleaned and the ultrasonic wave projection means is in registration with the second surface of the object to be cleaned;
    wherein the first surface of the object to be cleaned is simultaneously cleaned by the scrubbing means and by the ultrasonic wave generated by the ultrasonic wave projection means that has propagated from the first surface, through the object to be cleaned to the second surface; and
    wherein the object to be cleaned is not immersed or submerged in a cleaning solution.

17. The cleaning apparatus as set forth in claim 16, further comprising:
    cleaning agent supply means for supplying an aqueous cleaning agent onto the first surface of the object to be cleaned.

18. The cleaning apparatus as set forth in claim 16, further comprising:
    transport means for transporting the object to be cleaned.

19. The cleaning apparatus as set forth in claim 18, wherein:
    said transport means is transport rollers.

20. The cleaning apparatus as set forth in claim 18, wherein:
    said transport means is a belt conveyer.

21. The cleaning apparatus as set forth in claim 16, wherein:
    said scrubbing means is a cleaning brush.

22. The cleaning apparatus as set forth in claim 21, wherein:

said cleaning brush is a roll brush.

23. The cleaning apparatus as set forth in claim 21, wherein:

said cleaning brush is a disk brush.

24. The cleaning apparatus as set forth in claim 16, wherein:

said ultrasonic wave projection means is an ultrasonic nozzle for blowing the cleaning agent and generating an ultrasonic wave.

25. The cleaning apparatus as set forth in claim 16, wherein:

said cleaning agent supply means is a spray for radially spraying the aqueous cleaning agent.

26. The cleaning apparatus as set forth in claim 16, wherein:

said ultrasonic wave is megasonic in a frequency band within a range of from 850 kHz to 1 MHz.

27. The cleaning apparatus as set forth in claim 16, wherein:

said aqueous cleaning agent is at least one of pure water, superpure water, hydrogen water, ozone water, dilute hydrofluoric acid, and aqueous surface active agent.

* * * * *

UNITED STATES PATENT AND TRADEMARK OFFICE
CERTIFICATE OF CORRECTION

PATENT NO. : 6,810,548 B2  
DATED : November 2, 2004  
INVENTOR(S) : Hiroto Yoshioka et al.

It is certified that error appears in the above-identified patent and that said Letters Patent is hereby corrected as shown below:

Title page,
Item [56], References Cited, U.S. PATENT DOCUMENTS, please add the following cited reference:
-- 5,576,822    11/19/96    Nero R. Linblad, et al. --
OTHER PUBLICATIONS, please replace with the following:
-- Korean Patent Office Office Action dated April 30, 2004 for corresponding application no. 10-2001-11161 (2 pp.) and English Translation thereof (4 pp.) --.

Signed and Sealed this

Twenty-second Day of February, 2005

JON W. DUDAS
*Director of the United States Patent and Trademark Office*